(12) United States Patent
Lai et al.

(10) Patent No.: US 9,000,568 B2
(45) Date of Patent: Apr. 7, 2015

(54) SEMICONDUCTOR STRUCTURE AND FABRICATION METHOD THEREOF

(75) Inventors: Szu-Hao Lai, Kaohsiung (TW); Yu-Ren Wang, Tainan (TW); Po-Chun Chen, Tainan (TW); Chih-Hsun Lin, Ping-Tung County (TW); Che-Nan Tsai, Tainan (TW); Chun-Ling Lin, Tainan (TW); Chiu-Hsien Yeh, Tainan (TW); Te-Lin Sun, Kaohsiung (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 85 days.

(21) Appl. No.: 13/244,948

(22) Filed: Sep. 26, 2011

(65) Prior Publication Data

US 2013/0075874 A1    Mar. 28, 2013

(51) Int. Cl.
  *H01L 29/51*  (2006.01)
  *H01L 21/28*  (2006.01)
  *H01L 29/66*  (2006.01)

(52) U.S. Cl.
  CPC ........ *H01L 21/28185* (2013.01); *H01L 29/513* (2013.01); *H01L 29/517* (2013.01); *H01L 29/518* (2013.01); *H01L 29/66545* (2013.01)

(58) Field of Classification Search
  USPC .................. 257/410–411, 324, 761, E21.267, 257/21.29; 438/287, 786, 785, 216, 778
  See application file for complete search history.

(56) References Cited

U.S. PATENT DOCUMENTS

| | | |
|---|---|---|
| 5,498,768 A | 3/1996 | Nishitani |
| 6,063,698 A | 5/2000 | Tseng |
| 6,251,761 B1 | 6/2001 | Rodder |
| 6,380,104 B1 | 4/2002 | Yu |
| 6,492,217 B1 | 12/2002 | Bai |
| 6,642,066 B1 | 11/2003 | Halliyal |
| 6,656,852 B2 | 12/2003 | Rotondaro |
| 6,696,345 B2 | 2/2004 | Chau |
| 6,818,517 B1 | 11/2004 | Maes |
| 6,818,553 B1 | 11/2004 | Yu |
| 6,841,484 B2 | 1/2005 | Ying |
| 6,921,711 B2 | 7/2005 | Cabral, Jr. |
| 7,012,027 B2 | 3/2006 | Perng |
| 7,030,430 B2 | 4/2006 | Doczy |
| 7,126,199 B2 | 10/2006 | Doczy |
| 7,135,361 B2 | 11/2006 | Visokay |
| 7,157,378 B2 | 1/2007 | Brask |
| 7,160,767 B2 | 1/2007 | Brask |
| 7,208,366 B2 | 4/2007 | Tsai |
| 7,371,649 B2 | 5/2008 | Cheng |
| 7,381,608 B2 | 6/2008 | Brask |
| 7,384,880 B2 | 6/2008 | Brask |
| 7,488,656 B2 | 2/2009 | Cartier |
| 7,501,336 B2 | 3/2009 | Doyle |
| 7,521,324 B2 | 4/2009 | Ohmi |

(Continued)

OTHER PUBLICATIONS

Y. Kuo, "Effects of the TaNx interface layer on doped tantalum oxide high-k films", Vacuum 74 (2004) 539-547, Jan. 25, 2004.

*Primary Examiner* — Jose R Diaz
(74) *Attorney, Agent, or Firm* — Winston Hsu; Scott Margo

(57) ABSTRACT

A semiconductor structure includes a substrate, an oxide layer, a metallic oxynitride layer and a metallic oxide layer. The oxide layer is located on the substrate. The metallic oxynitride layer is located on the oxide layer. The metallic oxide layer is located on the metallic oxynitride layer. In addition, the present invention also provides a semiconductor process for forming the semiconductor structure.

12 Claims, 5 Drawing Sheets

(56) References Cited

U.S. PATENT DOCUMENTS

| | | |
|---|---|---|
| 7,601,648 B2 | 10/2009 | Chua |
| 7,655,994 B2 * | 2/2010 | Cartier et al. ............ 257/411 |
| 7,824,990 B2 | 11/2010 | Chang |
| 7,858,500 B2 | 12/2010 | Cartier |
| 8,441,010 B2 * | 5/2013 | Ichijo et al. ............ 257/43 |
| 2004/0007561 A1 | 1/2004 | Nallan |
| 2005/0202624 A1 | 9/2005 | Li |
| 2005/0275035 A1 | 12/2005 | Mathew |
| 2006/0054943 A1 | 3/2006 | Li |
| 2006/0094192 A1 | 5/2006 | Yang |
| 2006/0172548 A1 | 8/2006 | Wu |
| 2006/0211259 A1 | 9/2006 | Maes |
| 2006/0284271 A1 | 12/2006 | Doyle |
| 2008/0070395 A1 | 3/2008 | Yen |
| 2008/0116507 A1 * | 5/2008 | Ino et al. ............ 257/324 |
| 2008/0157231 A1 | 7/2008 | Wang |
| 2009/0057787 A1 | 3/2009 | Matsuki |
| 2009/0179283 A1 | 7/2009 | Adams |
| 2010/0062592 A1 | 3/2010 | Clark |
| 2010/0068877 A1 | 3/2010 | Yeh |
| 2010/0075507 A1 | 3/2010 | Chang |
| 2010/0081262 A1 | 4/2010 | Lim |
| 2010/0184281 A1 | 7/2010 | Hsu |
| 2010/0219481 A1 | 9/2010 | Tseng |
| 2010/0227479 A1 * | 9/2010 | Kim et al. ............ 438/778 |

* cited by examiner

SEMICONDUCTOR STRUCTURE AND FABRICATION METHOD THEREOF

BACKGROUND OF THE INVENTION

1. Field of the Invention

The present invention relates generally to a semiconductor structure and fabrication method thereof, and more specifically, to a semiconductor structure and fabrication method thereof, which forms a metallic nitride layer between a buffer layer and a metallic oxide layer.

2. Description of the Prior Art

In modern semiconductor processes, dielectric layers having a high dielectric constant are suited for use with metal gates. Due to the material difference, such as lattice constant difference, in a dielectric layer having a high dielectric constant and a substrate (such as a silicon substrate), a buffer layer is needed to be formed between both of them for buffering, wherein the dielectric layer having a high dielectric constant is often composed of a metallic oxide layer and the buffer layer is an oxide layer. In a semiconductor process such as a transistor process, at least a thermal annealing process is performed at different times according to processing methods. The thermal annealing process will cause the buffer layer to absorb the oxygen atoms in the metallic oxide layer formed on the buffer layer or imported during thermal annealing process, so that the thickness of the buffer layer is thickened, and the equivalent oxide thickness (EOT) of the semiconductor structure increases, thereby decreasing the electrical performance of the resulting semiconductor structure. In modern processes, the thickness of the forming buffer layer approaches the processing limitation and is not easy to be miniaturized. The thickened thickness of the buffer layer caused by the thermal annealing process will lead to a limitation of the semiconductor process, thereby retarding the miniaturization of the semiconductor components.

Therefore, a semiconductor structure and fabrication method thereof, for avoiding the thickness of the buffer layer from being thickened and the total equivalent oxide thickness (EOT) of the semiconductor structure from being increased, is needed in the industry.

SUMMARY OF THE INVENTION

The present invention provides a semiconductor structure and fabrication method thereof, which forms a metallic nitride layer between a metallic oxide layer and a buffer layer, to prevent the thickness of the buffer layer from being thickened as the thermal annealing process is performed, which causes the total equivalent oxide thickness of the semiconductor structure to increase.

The present invention provides a semiconductor structure including a substrate, an oxide layer, a metallic oxynitride layer and a metallic oxide layer. The oxide layer is located on the substrate. The metallic oxynitride layer is located on the oxide layer. The metallic oxide layer is located on the metallic oxynitride layer.

The present invention provides a semiconductor process including the following steps. A substrate is provided. An oxide layer is formed on the substrate. A metallic nitride layer is formed on the oxide layer. A metallic oxide layer is formed on the metallic nitride layer. A thermal treatment process is performed to oxidize the metallic nitride layer into a metallic oxynitride layer.

The present invention provides a semiconductor structure and fabrication method thereof, which forms a metallic nitride layer between a metallic oxide layer (a dielectric layer having a high dielectric constant) and an oxide layer (a buffer layer). Thus, after a thermal treatment process is performed, the metallic nitride layer will transform into a metallic oxynitride layer because of absorbing the oxygen atoms in the metallic oxide layer or imported during the thermal treatment process. In this way, the metallic nitride layer of the present invention can absorb and stop the oxygen atoms in the metallic oxide layer or imported during the thermal treatment process, so as to prevent the oxygen atoms from diffusing to the oxide layer, even to the substrate. Therefore, the semiconductor structure of the present invention can avoid the thickness of the oxide layer from being thickened, and the total equivalent oxide thickness of the semiconductor structure will not increase after the thermal treatment process, which would reduce the electrical performance of the semiconductor structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
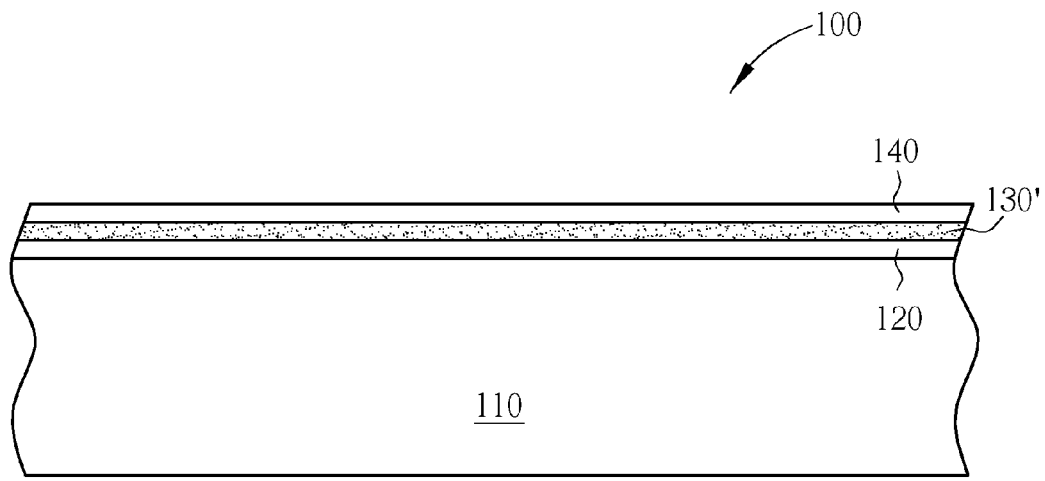
FIG. 1 schematically depicts a cross-sectional view of a semiconductor structure according to one preferred embodiment of the present invention.

FIG. 1 schematically depicts a cross-sectional view of a semiconductor structure according to one preferred embodiment of the present invention. A semiconductor structure 100 includes a substrate 110, an oxide layer 120, a metallic oxynitride layer 130 and a metallic oxide layer 140. The oxide layer 120 is located on the substrate 110. The metallic oxynitride layer 130 is located on the oxide layer 120. The metallic oxide layer 140 is located on the metallic oxynitride layer 130. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. The oxide layer 120 is used as a buffer layer for buffering the material difference, such as the lattice constant difference, in the substrate 110 and the metallic oxynitride layer 130 formed thereon. The oxide layer 120 may be a silicon dioxide layer, but it is not limited thereto. In one case, the metallic oxynitride layer 130 include a trivalent metallic oxynitride layer, wherein the trivalent metallic oxynitride layer may be a gallium oxynitride layer, an indium oxynitride layer, an aluminum oxynitride layer or a tantalum oxynitride layer etc. The metallic oxide layer 140 may include the group selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalite ($SrBi_2Ta_2O_9$, SBT), lead zirconate titanate ($PbZrxTi_1$- xO$_3$, PZT) and barium strontium titanate (BaxSr$_1$-xTiO$_3$, BST), but it is not limited thereto.

Figure 2:
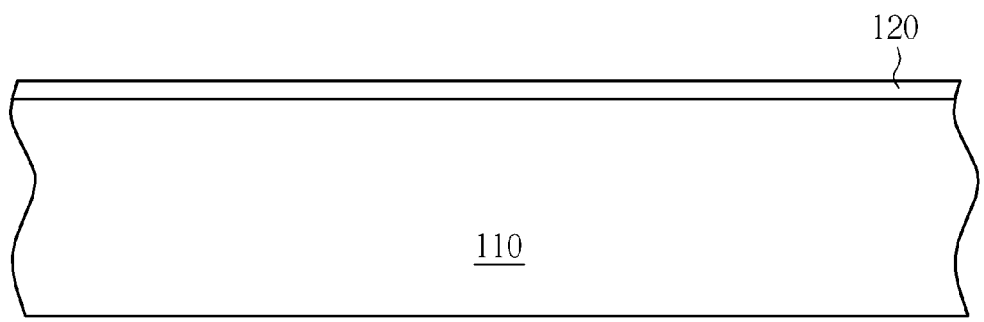
FIGS. 2-5 schematically depict a cross-sectional view of a semiconductor process according to one preferred embodiment of the present invention.

The methods of forming the semiconductor structure 100 are illustrated in the following. FIGS. 2-5 schematically depict a cross-sectional view of a semiconductor process according to one preferred embodiment of the present invention. As shown in FIG. 2, a substrate 110 is provided. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. An oxide layer 120 is formed on the substrate 110. As the substrate 110 is a silicon substrate, the oxide layer 120 may be a silicon dioxide layer, which may include a thermal oxide or a chemical oxide formed by a thermal oxidation process or a chemical oxidation process.

Figure 3:
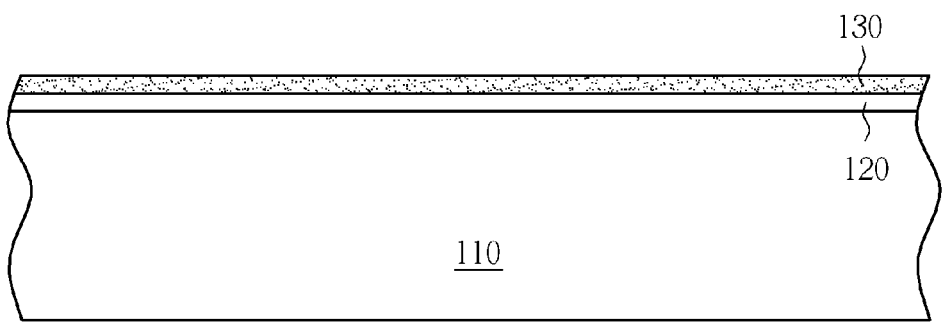

As shown in FIG. 3, a metallic nitride layer 130 is formed on the oxide layer 120. The metallic nitride layer 130 may include a trivalent metallic nitride layer, wherein the trivalent metallic nitride layer may be a gallium nitride layer, an indium nitride layer, an aluminum nitride layer, or a tantalum nitride layer, but it is not limited thereto.

Figure 4:
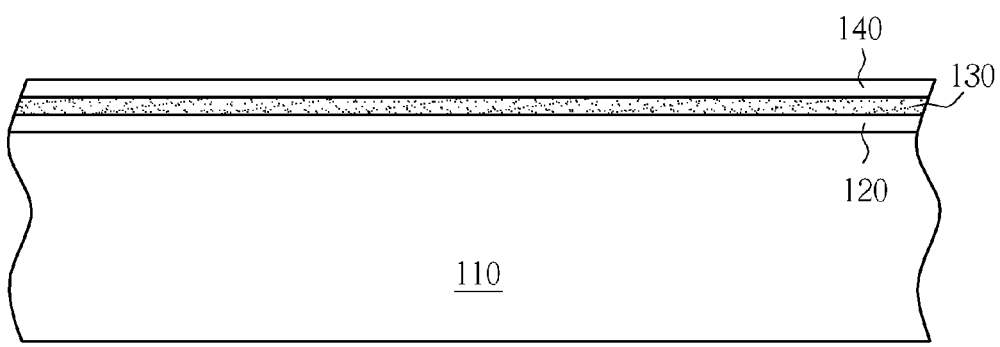

As shown in FIG. 4, a metallic oxide layer 140 is formed on the metallic nitride layer 130. The metallic oxide layer 140 may include the group selected from hafnium oxide (HfO$_2$), hafnium silicon oxide (HfSiO$_4$), hafnium silicon oxynitride (HfSiON), aluminum oxide (Al$_2$O$_3$), lanthanum oxide (La$_2$O$_3$), tantalum oxide (Ta$_2$O$_5$), yttrium oxide (Y$_2$O$_3$), zirconium oxide (ZrO$_2$), strontium titanate oxide (SrTiO$_3$), zirconium silicon oxide (ZrSiO$_4$), hafnium zirconium oxide (HfZrO$_4$), strontium bismuth tantalite (SrBi$_2$Ta$_2$O$_9$, SBT), lead zirconate titanate (PbZrxTi$_1$-xO$_3$, PZT) and barium strontium titanate (BaxSr$_1$-xTiO$_3$, BST), but it is not limited thereto. Besides, the metallic oxide layer 140 may be formed by an atomic layer deposition (ALD) process.

Figure 5:
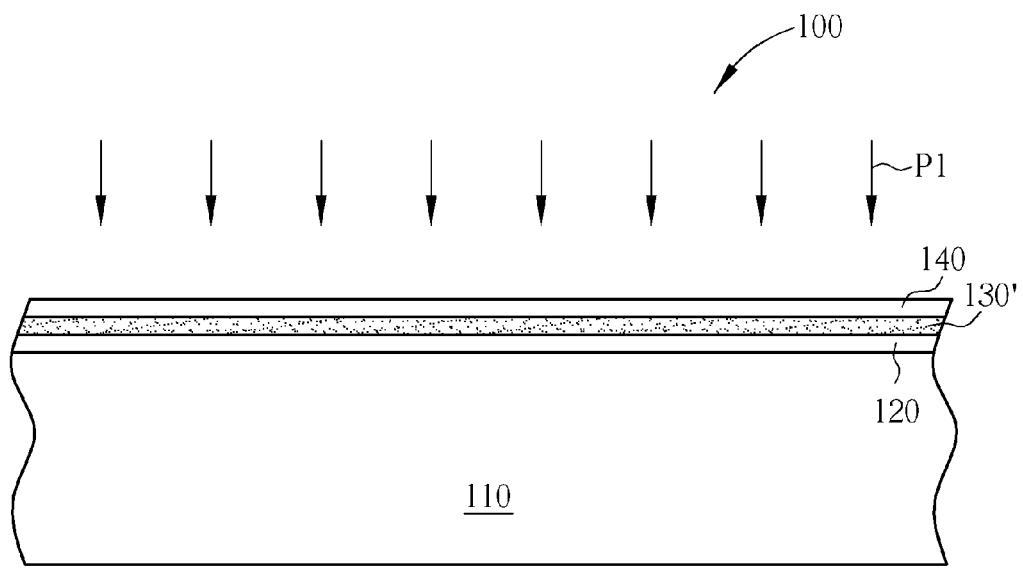

As shown in FIG. 5, a thermal treatment process P1 is performed to oxidize the metallic nitride layer 130 into a metallic oxynitride layer 130'. The thermal treatment process P1 may include a thermal annealing process, wherein the thermal annealing process may be a rapid thermal annealing (RTA) process, a rapid thermal processing (RTP) process or an oxygen containing thermal annealing process, but it is not limited thereto. In one embodiment, the oxygen atoms of oxidizing the metallic nitride layer 130 are from the imported oxygen during the thermal annealing process P1. In another embodiment, the oxygen atoms of oxidizing the metallic nitride layer 130 are from the metallic oxide layer 140. In addition, the oxygen atoms of oxidizing the metallic nitride layer 130 may be from both the imported oxygen during the thermal annealing process P1 and the metallic oxide layer 140. Furthermore, if the oxygen atoms of oxidizing the metallic nitride layer 130 are from the metallic oxide layer 140, a part of the metallic oxide layer 140 will be reduced as the metallic nitride layer 130 is oxidized, meaning the thickness of the metallic oxide layer 140 is thinner as the metallic nitride layer 130 is being oxidized.

Due to the metallic nitride layer 130 being formed between the oxide layer 120 and the metallic oxide layer 140, the metallic nitride layer 130 will be oxidized by the oxygen atoms or oxygen molecules in the metallic oxide layer 140 or imported during the thermal treatment process P1, as the thermal treatment process is performed, so that the metallic nitride layer 130 transforms to the metallic oxynitride layer 130'. The thermal treatment process P1 usually represents a thermal treatment process that must be performed for forming a part of a transistor structure in current semiconductor processes such as transistor processes. For instance, the thermal treatment process P1 may be a post source/drain region annealing process performed after a source/drain region is performed to diffusing impurities implanted in the source/drain region to distribute in the desired formed region of substrate. However, as the thermal treatment process P1 is performed, the semiconductor structure 100 would also be heating up and cause the thickness of the oxide layer 120 to increase. The metallic nitride layer 130 of the present invention can absorb and stop the oxygen atoms in the metallic oxide layer 140 or oxygen molecules imported during the thermal treatment process P1, and therefore prevent the oxygen atoms or oxygen molecules from diffusing to the oxide layer 120, so as to prevent the thickness of the oxide layer 120 from increasing, and the total equivalent oxide thickness (EOT) of the semiconductor structure 100 will be restrained from increasing.

Otherwise, the metallic nitride layer 130 formed in the semiconductor structure 100 of the present invention before the thermal treatment process P1 is performed as well as the metallic oxynitride layer 130' formed in the semiconductor structure after the thermal treatment process P1 is performed both have higher dielectric constants than the oxide layer 120. For example, as the metallic nitride layer 130 is a gallium nitride layer and the metallic oxynitride layer 130' is therefore a gallium oxynitride layer, the dielectric constant of the metallic nitride layer 130 and the metallic oxynitride layer 130' will both be higher than the dielectric constant of the oxide layer 120, such as a silicon dioxide layer which dielectric constant is 3.9. This is because the dielectric constant of the metallic nitride layer 130 is 9.5 and the metallic oxynitride layer 130' is 9.5-10.6 (due to the metallic nitride layer 130 being 9.5 and the metallic oxide layer being 10.6, the dielectric constant of the metallic oxynitride layer 130' should range between both of them). If the total thickness of the oxide layer 120 and the metallic nitride layer 130 or the total thickness of the oxide layer 120 and the metallic oxynitride layer 130' is equal to the thickness of the oxide layer of the prior art, the equivalent oxide thickness (EOT) of the semiconductor structure 100 (even before reacting to the metallic oxynitride layer 130') will be less than the equivalent oxide thickness (EOT) of the prior art.

Figure 6:
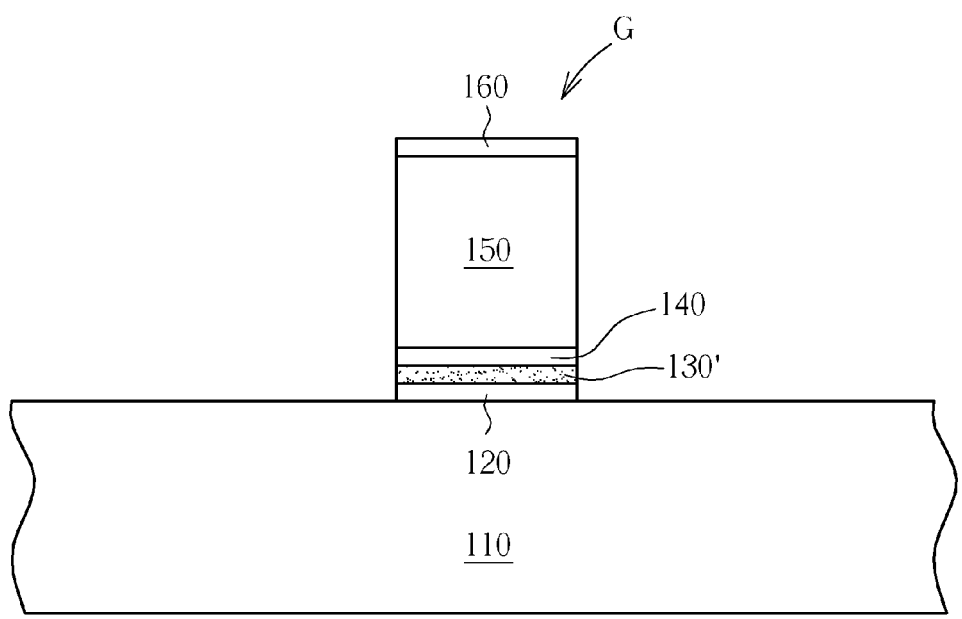
FIGS. 6-10 schematically depict a cross-sectional view of a transistor process according to one preferred embodiment of the present invention, which applies the semiconductor process of the present invention.

Furthermore, the semiconductor process of the present invention can be applied to semiconductor processes such as transistor processes. FIGS. 6-10 schematically depict a cross-sectional view of a transistor process according to one preferred embodiment of the present invention, which applies the semiconductor process of the present invention. After the steps of FIG. 4 are performed, a barrier layer (not shown) may be selectively formed (as shown in FIG. 6). Then, a gate electrode layer 150 and a cap layer 160 may be sequentially formed, wherein the barrier layer may be a titanium nitride layer or a tantalum nitride layer, the gate electrode layer 150 may be a sacrificed polysilicon gate electrode layer, and the cap layer 160 may be a nitride layer, but they are not limited thereto. The cap layer 160, the gate electrode layer 150, the metallic oxide layer 140, the metallic oxynitride layer 130' and the oxide layer 120 are patterned to form a gate structure G.

Figure 7:
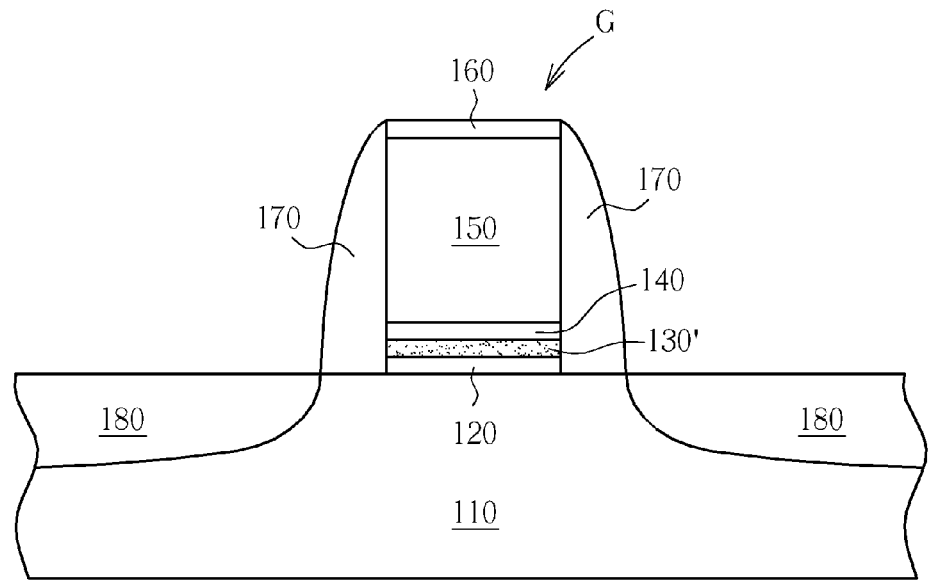

As shown in FIG. 7, a spacer 170 is formed beside the gate structure G. An ion implantation process is performed to automatically align and form a source/drain region 180 in the substrate 110 beside the spacer 170.

Figure 8:
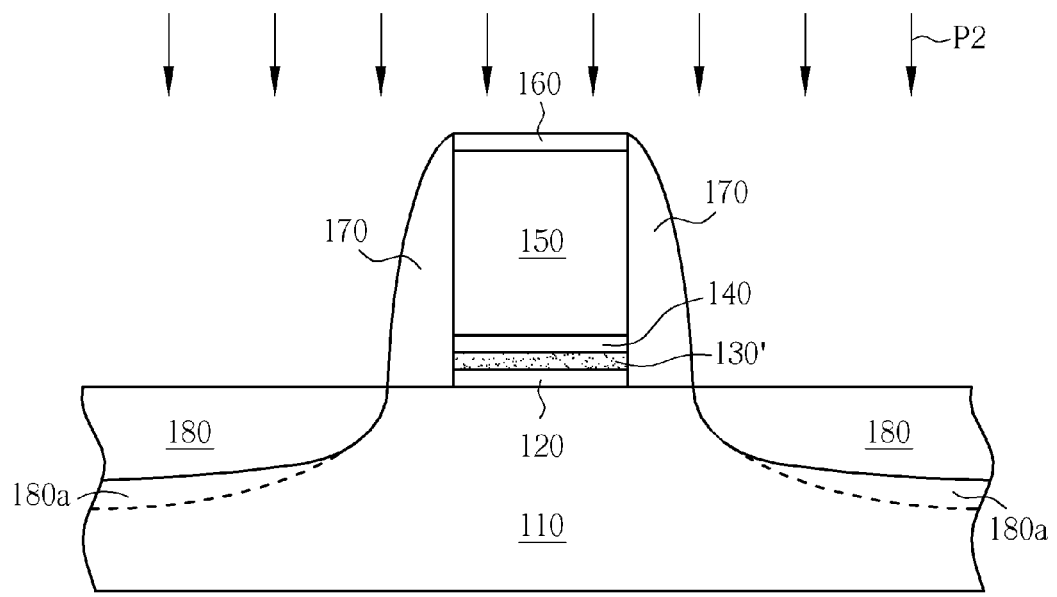

As shown in FIG. 8, a post source/drain region annealing process P2 is performed to make the impurities in the source/drain region 180 diffuse outward and the source/drain region 180 will therefore extend to a source/drain region 180a. The post source/drain region annealing process P2 can correspond to the aforesaid thermal treatment process P1 of the semiconductor process of the present invention. Specifically speaking, the thermal treatment process P1 is restrained to being performed after the metallic oxide layer 140 is formed, but is not limited to being performed after the metallic oxide layer 140 is formed.

Figure 9:
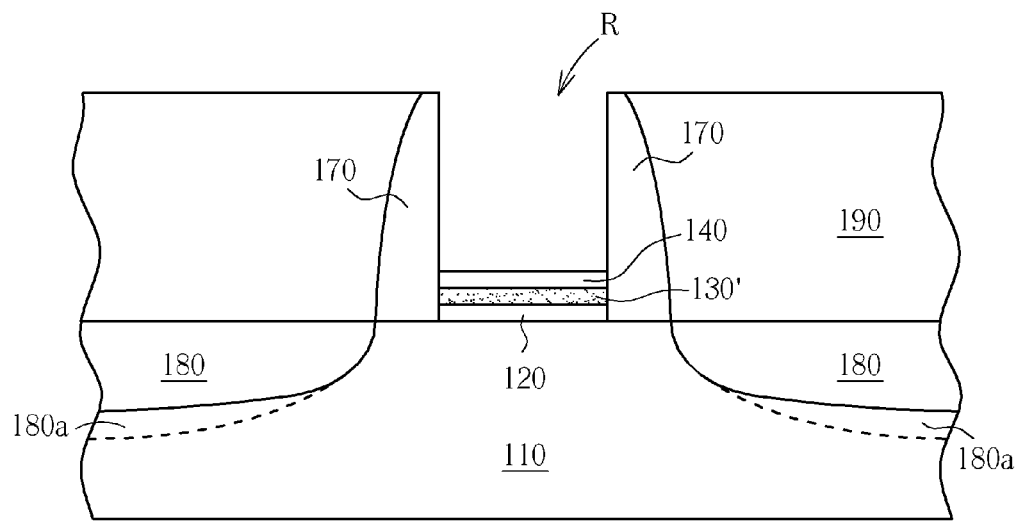
Figure 10:
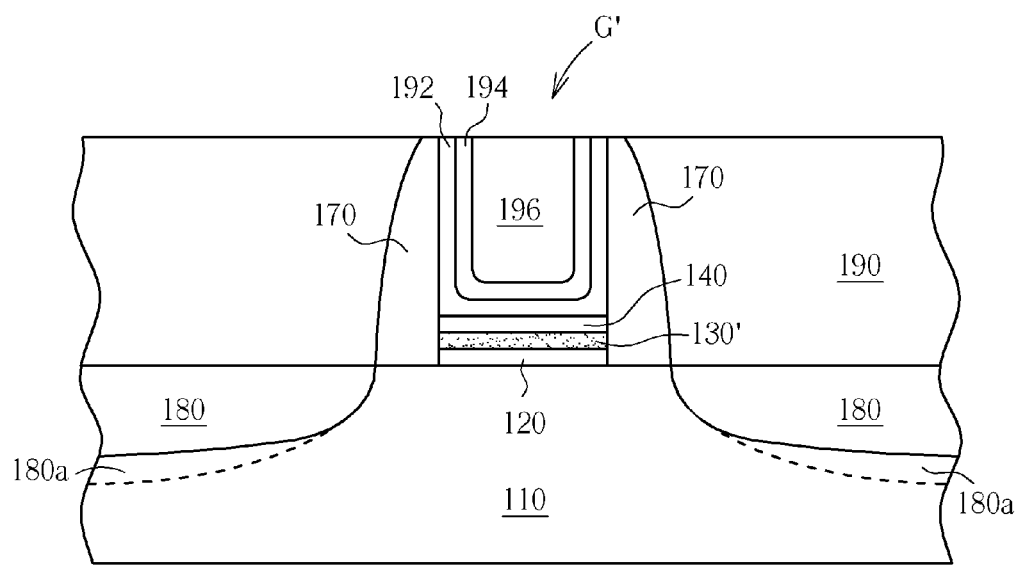

As shown in FIG. 9, an interdielectric layer 190 is formed and polished to expose and remove the gate electrode layer 150 and a recess R is therefore formed. As shown in FIG. 10, a work function metal layer 192, a stop layer 194 and a metal electrode layer 196 are sequentially filled to form a metal gate G'.

The aforesaid embodiment applies a gate-last for high-k first process as an example, but a gate-first process or a gate-last for high-k last process may also be performed additionally. If the gate-first process is applied, the order of forming the metallic oxide layer 140 is the same as this embodiment, but the gate electrode layer 150 is a metal electrode layer directly formed without a sacrificed polysilicon gate electrode layer being formed. If the gate-last for high-k last process is applied, the metallic nitride layer 130 can be formed right after the oxide layer 120 is formed (although the dielectric layer having a high dielectric constant is performed after the post source/drain region annealing process is performed), to prevent oxygen atoms imported during the post source/drain region annealing process P2 from diffusing to the oxide layer 120, even to the substrate 110. The methods of forming metal gates are known in the art, and so are not described herein.

Above all, the present invention provides a semiconductor structure and fabrication method thereof, which forms the metallic nitride layer between the oxide layer (the buffer layer) and the metallic oxide layer (the dielectric layer having a high dielectric constant), so that the metallic nitride layer will transform to the metallic oxynitride layer by absorbing the oxygen atoms in the metallic oxide layer and imported during the thermal treatment process after the thermal treatment process is performed (the thermal treatment process usually represents the processing steps must be performed during the semiconductor process). In this way, the metallic nitride layer of the present invention can absorb and stop the oxygen atoms in the metallic oxide layer and imported during the thermal treatment process and prevent the oxygen atoms from diffusing to the oxide layer and even to the substrate. Thus, the semiconductor structure of the present invention can avoid the thickness of the oxide layer from being thickened, and the total equivalent oxide thickness of the semiconductor structure can also be prevented from increasing, which would reduce the electrical performance of the semiconductor structure. Otherwise, the dielectric constant of the metallic nitride layer such as the gallium nitride layer applied in the present invention and the dielectric constant of the metallic oxynitride layer nitridized from the metallic nitride layer are both larger than or essentially equal to the dielectric constant of the oxide layer, so that the semiconductor structure of the present invention has a larger equivalent dielectric constant than the prior art or an essentially equal equivalent dielectric constant to the prior art.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
   a substrate;
   an oxide layer located on the substrate;
   a metallic oxynitride layer located on the oxide layer, wherein the metallic oxynitride layer comprises an indium oxynitride layer;
   a metallic oxide layer located on the metallic oxynitride layer, wherein the metallic oxide layer comprises a hafnium oxide layer or a zirconium oxide layer; and
   a gate electrode layer directly covering the entire metallic oxide layer.

2. The semiconductor structure according to claim 1, wherein the oxide layer comprises a silicon dioxide layer.

3. A semiconductor process, comprising:
   providing a substrate;
   forming an oxide layer on the substrate;
   forming a metallic nitride layer on the oxide layer, wherein the metallic nitride layer comprises a gallium nitride layer or an indium nitride layer;
   forming a metallic oxide layer on the metallic nitride layer;
   forming a gate electrode layer directly covering the entire metallic oxide layer; and
   performing a thermal treatment process after the gate electrode layer is formed to oxidize the metallic nitride layer into a metallic oxynitride layer wherein at least a part of the metallic oxide layer still remains.

4. The semiconductor process according to claim 3, wherein the oxide layer comprises a silicon dioxide layer.

5. The semiconductor process according to claim 4, wherein the substrate comprises a silicon substrate and the silicon dioxide layer comprises being formed by a thermal oxidation process or a chemical oxidation process.

6. The semiconductor process according to claim 3, wherein the metallic oxynitride layer comprises a gallium oxynitride layer or an indium oxynitride layer.

7. The semiconductor process according to claim 3, wherein the metallic oxide layer comprises a hafnium oxide layer or a zirconium oxide layer.

8. The semiconductor process according to claim 3, wherein the thermal treatment process comprises a thermal annealing process.

9. The semiconductor process according to claim 8, wherein the thermal annealing process comprises a rapid thermal annealing process or an oxygen-containing thermal annealing process.

10. The semiconductor process according to claim 8, wherein oxygen atoms used during performing the thermal treatment process to oxidize the metallic nitride layer are from the thermal annealing process.

11. The semiconductor process according to claim 3, wherein oxygen atoms used during performing the thermal treatment process to oxidize the metallic nitride layer are from the metallic oxide layer.

12. The semiconductor process according to claim 11, wherein after performing the thermal treatment process, the thickness of the metallic oxide layer is thinning.

* * * * *